3,738,917

METHOD FOR SIMULTANEOUS PRODUCTION OF A PLURALITY OF EQUAL SEMICONDUCTOR COMPONENTS WITH A PN JUNCTION FROM A SINGLE SEMICONDUCTOR WAFER

Werner Spath, Munich, Germany, assignor to Siemens Aktiengesellschaft, Berlin, Munich, and Erlangen, Germany Filed Aug. 16, 1971, Ser. No. 171,957
Claims priority, application Germany, Aug. 18, 1970, P 20 41 035.9
Int. Cl. B01d *59/40;* C23b *5/48*
U.S. Cl. 204—15 5 Claims

ABSTRACT OF THE DISCLOSURE

Following the production of a plurality of equal semiconductor components in one semiconductor wafer, the front part of the wafers that is bordered by all components, was subjected to electrolytical processing which influences the defective components, permanently, and differently than those which are in good order. After severing of the semiconductor wafer, the components are subsequently used or valued according to these permanent differences.

The invention relates to a method of simultaneously producing a plurality of equal semiconductor components with a pn junction from a single semiconductor wafer, particularly according to the planar or mesa technique.

Such methods are commonly used in modern semiconductor technology. Since it is desirable to execute as many method steps as possible prior to severing the semiconductor wafer into individual components. Only those steps which require the individual components for their execution; such as mounting, are carried out following the severing of the semiconductor wafer.

During factory production it is inevitable that out of the plurality of components fabricated from a single semiconductor wafer, some will be of inadequate quality. The magnitude of the biasing voltage or biasing current of the pn junction is a criterion for the quality.

It is an object of the invention to utilize this criterion of the biasing voltage or biasing current to the extent that the individual structural components united in the semiconductor wafer, obtain a characteristic which indicates whether the individual component meets the requirements with respect to biasing voltage or biasing current.

To this end, following the production of the pn junctions belonging to the individual semiconductor components that are present in the semiconductor wafer, I provide the back side of the wafer with an electrode which is shared by all components in the system or that the electrodes subordinated to the individual components be connected in parallel. The front side of the wafers is then contacted with an electrolyte which is suitable for anodic oxidation, electrolytical removal of the semiconductor material (or electrode material, which may be present on the front side) and/or precipitating metal. At the same time, at least one pn junction of the semiconductor components is poled in biasing direction and, after completion of the electrolytical process, the wafer is severed into individual components. The electrolyte is selected so that in currentless condition, it will not exert any noticeable effect upon the semiconductor or its electrodes.

Preferably, the semiconductor crystal is connected as an anode specially when using an electrolyte capable of anodic oxidation. The voltage used is so chosen that it is identical with the tolerance for the biasing voltage or the biasing current. For components which do not comply with this tolerance, the current flowing acoss the pn junction of said components, is appropriately high. This again shows up in the electrolytical effect. It becomes understandable that only one side of the biasing pn junction may be in conductive connection with the electrolyte, i.e. that the pn junction is not short circuited.

The usual method for testing semiconductor systems with a pn junction in the above described simultaneous production of a plurality of equal semiconductor components with a pn junction, from a single semiconductor wafer, is effected by mounting a measuring point upon the contact spots of the semiconductor systems and by measuring the biasing voltages and biasing currents of the semiconductor systems. Systems which deviate from the required limit data are specially marked, for example, with ink and following the breaking up of the semiconductor wafer, are sorted into individual structural components. The measuring and marking is effected by means of appropriate or completely or partially automated equipment, which is expensive to buy and whose mechanical structure was found to be very susceptible to trouble.

According to the method of the invention, the individual system is no longer measured but the metallic contact of all defective systems on the entire semiconductor crystal is simultaneously electrolytically removed. Another variation is the utilization of the oxidation effect of certain electrolyte baths by anodic oxidation, whereby the degree of utilization again depends on the current intensity, that is on the biasing characteristics of the respective pn junctions in the individual systems. Hence, because of the method of the invention, in all cases the defective systems becomes noticeable with respect to its adjacent systems, through some changes in its surface, be it a thickened oxide layer or an increased removal. Via the voltages between the semiconductor crystal as the anode and cathode in the electrolyte, and the etching time, the desired limit data can be adjusted with respect to biasing voltage and biasing current. If the front side of the semiconductor wafer is already provided with electrodes, these are particularly adversely affected by the afore described electrolytical processes. For example, in defective systems, a metallic contact will be discolored through anodic oxidation, so that the defective systems, i.e. those not within the tolerance limit, are easy to recognize.

The advantage of this method is that a large number of wafers may be tested simultaneously and that much time is saved compared to the known testing method, i.e. testing each semiconductor component separately.

The execution of the method according to the invention will be described in greater detail with reference to the drawing, wherein.

Figure 1:
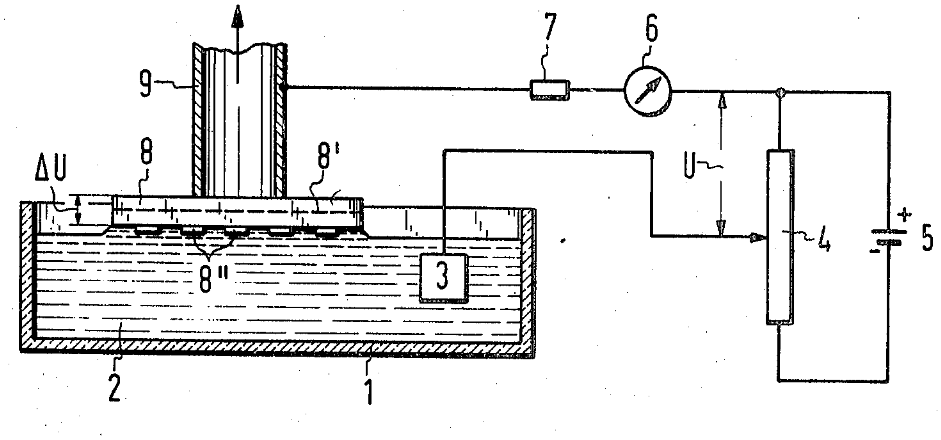
FIG. 1 shows the systems for carrying out the invention.

The device used in FIG. 1 utilizes an electrolytic vessel 1, filled with an electrolyte 2 capable of anodic oxidation. A counter electrode 3 dips into said vessel 1 and, in the example, constitutes the cathode. The cathode is connected to a potentiometer 4, at which a voltage drop is produced by a DC voltage source 5. An ammeter 6 and a current limiting resistor 7 control the electrolyte currents. The semiconductor wafer to be processed is immersed with its front side, into the electrolyte and is held in this position by a stationary suction pipette 9, which simultaneously defines the electrical connection to the above described circuit. It contacts the back side of the semiconductor wafer 8 wherein all semiconductor components end. The components on the front side are separated by pn junctions or may be provided with individual electrodes 8''. Between the front side and the back side of the semiconductor wafer 8, is at least one biasing pn junction 8' which if it ends at the front side of the wafer, should be covered with an insulating protective layer, against the electrolyte. In no case may this pn junction contact the electrolyte, since, otherwise, the electrolyte would short-circuit the pn junction.

The front side of that semiconductor system whose breakthrough voltage is now lower than the present potential difference ΔU between the wafer back side and the electrolyte 2, is anodically oxidized or removed and may therefore be recognized, for example, by the absence of electrode 8''. At least for the time being, the remaining systems are unchanged. A reduction of the starting current is a result, however, with the anodic oxidation of portions of the wafer front side. This reduces the total current. But, due to the selected circuit, the potential difference ΔU between the electrolyte and the back side of the wafer rises automatically. Hence, semiconductor systems with a somewhat higher biasing voltage oxidize anodically, also. The increase in potential difference ΔU finally stops automatically.

It is remarkable that the ratio of breakthrough current to biasing current is higher than $10^{+4}$, in a standard instance, particularly in devices made of silicon. The oxidation rate in the above described method is adjusted accordingly. Systems whose biasing current is too high, e.g. having ten-fold datum value at a specific voltage, are oxidized appropriately more. A suitable selection of the oxidation period makes it possible, for example, to completely remove the contacts of systems with a ten-fold biasing current while the remaining systems which meet the requirements, lost only a fraction, e.g. $1/10$ of the force of their contacts 8'' or of semiconductor material.

As previously mentioned, it is also possible to employ a variable etching rate of the individual systems for characterizing the biasing qualities of the individual elements.

In the afore-described embodiments of the method of the invention, the semiconductor wafer is applied to anode potential. For this, the pn junction to be tested must be poled in biasing direction. If semiconductor diodes are used, the requirements can only be fulfilled if the semiconductor material which is adjacent to the electrolyte is p-conductive. If the individual diode is then so mounted in the wafer that p-conducting zones are embedded into n-conducting original material, based on the planar method, which means that the back side of the wafer is n-conductive, then according to the device illustrated in FIG. 1, the back side of the wafer will be contacted with a single common electrode and the method carried out as above.

If, however, the embedded zones are n-conducting and the original material p-conducting, the n-conducting zones must be connected in parallel and become electrically connected with the limting resistor 7, in FIG. 1. For geometrical reasons, the suction electrode cannot be used, or only with great difficulty for contacting purposes and a special suction pipette must be provided for holding the semiconductor wafer. The wafer side with the p-conducting original material is then brought into contact with the electrolyte 2, in uncovered condition. Since the currents are essentially limited to those regions of the wafer front side, which are directly opposite to the individual portions of the pn junctions that are parallel to the wafer front side; the oxidation or removal will occur at those places of the wafer front side which happens to be exactly opposite to such a pn junction. This phenomena, too, can be used for characterizing the defective systems.

If there are semiconductor devices with many pn junctions, particularly transistors or pnpn diodes, then the pn junction or junctions, to be tested, will be poled in biasing direction, according to the afore going explanations. Here, too, care must be taken that the pn junction to be tested is positioned in biasing direction. On the other hand, it makes no difference whether p or n conducting material is adjacent to the electrolyte.

The former variants of the method of the invention were executed in such a way that the semiconductor wafer to be tested was connected as an anode. Basically, however, a testing process may also be carried out where the semiconductor wafer to be tested is connected as a cathode. In this instance, the electorlyte consists of a salt solution of the contacing material, e.g. a chromium or nickel salt. Since the pn junction to be tested must also be positioned in biasing direction, a stronger electrolytic current will flow across the bad systems and effect a metal preciptation on said bad systems. Thus, the conditions are exactly opposite to the former embodiments so that the required conditions can easily be read from the above example.

It is desirable, however, to limit the metallization not only to the bad but to the good systems. This is actually possible if, according to another feature of the invention, the semiconductor wafer to be tested, which is provided with the semiconductor components, is placed in form of an electrode into contact with an electrolyte, capable of precipitating metal during the flow of current. The pn junctions of the systems, to be examined, are together traversed with an alternating current or with AC pulses, whose peak intensity corresponds approximately to the admixible tolerance. The device illustrated in the figure can be used, for the most part, with an appropriate AC source.

During the metal precipitation phase, the semiconductor surface must be connected as a negative pole. With respect to the pn junctions that are present, it is also necessary for an adequate current to flow during this phase, across the pn junctions being tested. Hence, the pn junctions must be poled in forward direction, while the semiconductor is applied to a cathode potential.

If a plurality of planar diode structures is to be obtained, for example, during the production of planar diodes in an n conducting semiconductor wafer, using an appropriate masking of $SIO_2$, by diffusing acceptor atoms, the planar diode structures being covered with the $SiO_2$ layer (with the exception of the n-conducting wafer back side and the area for the electrical connection of the p-zones) and being insulated thereby, then, in order to comply with the required, the n-zone becomes negative relative to the pn zone. The pn zone is contacted with the electrolyte, while the n-zone is contacted with the electrode 9.

When the conductivity is uniform in both current directions, such as in short circuit systems, the metal that precipitates during the negative half wave is removed again during the positive half wave, while the good systems lie in biasing direction during the positive half wave and thus can no longer lose their metallization. The absolute voltage amplitude of the negative half wave of the wafer must be higher than the diffusion voltage of the diode. The positive voltage amplitude, on the other hand, must not be higher than the breakthrough voltage of the diode.

If a positive DC voltage at the wafer is superimposed by an alternating voltage whose absolute voltage amplitude of the negative half wave is higher than the applied direct voltage, only such systems will be metallized whose biasing voltage is higher than the applied positive direct voltage. The sum of the applied positive DC voltage and the absolute voltage amplitude of the positive half wave should not exceed the biasing voltage. The direct current may also be a pulsating direct current.

To realize the appropriate operating conditions, it is recommended that the regulating resistor, e.g. a potentiometer 4 which adjusts the current intensities, is connected in parallel with a rectifier with the appropriate polarity and this potentiometer be applied to electrode 9 and to counter electrode 3. The superimposition of an alternating current with rectifier AC pulses, whose relationship may be adjusted as desired, is applied to the semiconductor wafer and the electrolyte.

It is conceivable that the short circuit systems may be, at least temporarily, short circuited through such pulses so that the precipitation conditions do not become asymmetrical. For these reasons, the defective systems have no precipitation. However, in the good systems, a marked precipitation of metal occurs at the surface, due to the unvaried maintenance of the rectifier effect.

Figure 2:
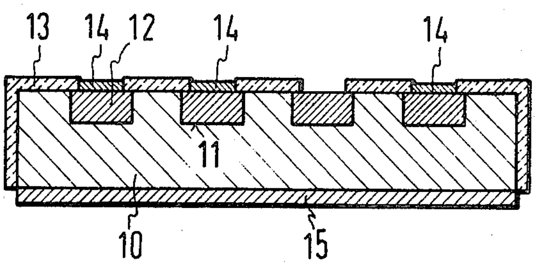
FIG. 2 shows a wafer treated in accordance with the invention.

The resulting product is illustrated in FIG. 2. Here, several diodes of pn and np type are produced in one semiconductor wafer, using the planar method. The original material of the semiconductor wafer is denoted 10; the pn junctions 11 and the embedded zones of the diodes 12. The front side and the lateral portions of the semiconductor wafer 10 are covered with a $SiO_2$ layer 13, wherein only the locations which serve for contacting zone 12 are left exposed by appropriate windows. The back side of the wafer is contacted with an electrode 15 which leads directly to a limiting resistor according to FIG. 1. Otherwise the device, according to FIG. 1, may be taken over unchanged. An AC source or a source producing AC pulses is used in place of a DC source 5. Moreover, the electrolyte 2 must be suitable for precipitating contact metal. The device obtained through AC operation has a metallization 14, at the contact locations of zone 12, as previously mentioned. No metal precipitation or only an insufficient one occurs at the bad systems (e.g. the third from the left). These systems are therefore marked useless and are discarded during further processing. The metallization 14 of the good systems is utilized for their further contacting. Hence, it is sintered, or bonded by alloying, with the material of the semiconductor zone 12. The auxiliary electrode 14 is usually removed following the testing and prior to severing the wafer into individual semiconductor components.

The systems provided with the above-described characteristics, which do not meet the requirements, can still be recognized; they are then removed from the manufacturing process.

I claim:

1. Method for producing a plurality of equal semiconductor components with pn junction from a single semiconductor wafer, comprising producing pn junctions that are individually coordinated to the semiconductor components according to planar or mesa technique so that they define one zone of one conductance type per semiconductor component that is limited to the front side of the semiconductor wafer, said zone being limited through pn junctions coordinated to the respective semiconductor component by a semiconductor zone which occupies the backside of the semiconductor components, providing an insulating layer covering the surface of said semiconductor wafer at least at the locality of said pn junction and so arranged that it does not cover one contact point, respectively, of the semiconductor zones limited to the front side of the semiconductor wafer and one contact point of the zone on the backside of the semiconductor wafer, applying a periodic alternating voltage by means of an electrode which contacts the backside of the semiconductor wafer and by means of an electrolyte which contacts the contact points of said zones on the front side of the semiconductor wafer, said electrolyte containing the solution of a salt of a contacting metal so that after the processing is finished, a portion of the contact points of said zones are metallized on the front side of the semiconductor wafer while the rest are not metallized, dividing the semiconductor wafer into individual semiconductor components and separating the metallized components from the non-metallized components.

2. The method of claim 1 comprising applying a positive DC voltage at the wafer superimposed by an alternating voltage.

3. The method of claim 2 wherein said alternating voltage has an absolute voltage amplitude of the negative half wave higher than the applied direct voltage.

4. The method of claim 1, wherein the blocking voltage to be applied is identical with the tolerance for blocking voltage that is allowed for the components.

5. The method of claim 1, wherein an alternating current source is so used that the semiconductor body is at times the cathode, with all pn junctions simultaneously being poled in forward direction, while at other times the anode with the pn junction is blocked.

References Cited

UNITED STATES PATENTS

| | | | |
|---|---|---|---|
| 3,379,625 | 4/1968 | Csabi | 204—1 T |
| 3,384,556 | 5/1968 | Rohde | 204—1 T |
| 3,616,284 | 10/1971 | Bodmer et al. | 204—16 |

JOHN H. MACK, Primary Examiner

T. TUFARIELLO, Assistant Examiner

U.S. Cl. X.R.

204—1 T, 129.65